United States Patent
Remonnay et al.

(10) Patent No.: US 7,442,000 B2
(45) Date of Patent: Oct. 28, 2008

(54) METHOD AND DEVICE FOR EXTRACTING ELECTRONIC COMPONENTS FROM TUBES AND ELECTRONIC COMPONENT FEEDING DEVICE

(75) Inventors: Emmanuel Remonnay, Villers le Lac (FR); Jean-Pierre Ehrensperger, La Chaux-de-Fonds (CH); Pierre-Alain Chenal, Les Brenets (CH)

(73) Assignee: Ismeca Semiconductor Holding SA, La Chaux-de-Fonds (CH)

( * ) Notice: Subject to any disclaimer, the term of this patent is extended or adjusted under 35 U.S.C. 154(b) by 367 days.

(21) Appl. No.: 10/941,230

(22) Filed: Sep. 14, 2004

(65) Prior Publication Data
US 2005/0117979 A1    Jun. 2, 2005

Related U.S. Application Data

(63) Continuation of application No. PCT/CH03/00606, filed on Sep. 8, 2003.

(30) Foreign Application Priority Data
Mar. 7, 2003    (CH)    ................................. 0366/03

(51) Int. Cl.
*B65G 59/08*    (2006.01)

(52) U.S. Cl. ........................... 414/403; 414/810

(58) Field of Classification Search ................ 414/403, 414/404, 417, 816, 410; 406/19
See application file for complete search history.

(56) References Cited

U.S. PATENT DOCUMENTS

| | | | | |
|---|---|---|---|---|
| 379,890 A | * | 3/1888 | Given | .......................... 406/179 |
| 3,408,113 A | * | 10/1968 | Bouladon | ..................... 406/19 |
| 4,240,768 A | * | 12/1980 | Carstens | ....................... 406/19 |
| 4,770,565 A | | 9/1988 | Upton | |
| 4,801,044 A | | 1/1989 | Kubota et al. | |
| 4,862,578 A | | 9/1989 | Holcomb | |
| 5,117,963 A | * | 6/1992 | Thayer et al. | ................. 198/395 |
| 5,267,395 A | * | 12/1993 | Jones et al. | ..................... 29/829 |
| 5,368,193 A | | 11/1994 | Takahashi et al. | |
| 5,518,545 A | * | 5/1996 | Miyano | ........................ 118/500 |
| 5,570,812 A | | 11/1996 | Ando et al. | |
| 5,733,093 A | * | 3/1998 | Palm et al. | .............. 414/416.04 |
| 6,024,208 A | | 2/2000 | Chooi et al. | |
| 6,385,842 B1 | | 5/2002 | Davis, III | |
| 6,478,533 B2 | | 11/2002 | Davis, III | |
| 6,796,454 B1 | * | 9/2004 | Matthews et al. | ............ 221/197 |
| 2002/0067980 A1 | * | 6/2002 | Havich et al. | ................. 414/403 |

FOREIGN PATENT DOCUMENTS

EP    0 684 757 A1    5/1995

* cited by examiner

*Primary Examiner*—Charles A Fox
(74) *Attorney, Agent, or Firm*—Pearne & Gordon LLP (57) ABSTRACT

Method for extracting electronic components (8, 8', 8") from a tube (7), the electronic components (8, 8', 8") being extracted from the tube (7) with pneumatic means. Device for extracting electronic components (8, 8', 8") from a tube (7) comprising a pneumatic system for extracting electronic components (8, 8', 8") from a tube (7) and device for feeding with electronic components (8, 8', 8") a processing line (9) comprising such an extraction device. The use of pneumatic means for extracting electronic components (8, 8', 8") offers among other advantages that of allowing the tube to remain in horizontal position whilst avoiding the use of delicate and complicated mechanical means.

27 Claims, 6 Drawing Sheets

METHOD AND DEVICE FOR EXTRACTING ELECTRONIC COMPONENTS FROM TUBES AND ELECTRONIC COMPONENT FEEDING DEVICE

REFERENCE DATA

This application is a continuation of PCT application 2003WO-CH00606 (WO04052069) filed on Sep. 8, 2003, under priority of Swiss patent application 2003CH-0366 filed on Mar. 7, 2003, the contents whereof are hereby incorporated.

FIELD OF THE INVENTION

The present invention concerns a method and a device for extracting electronic components from tubes, as well as an electronic component feeding device comprising such a device.

DESCRIPTION OF RELATED ART

Electronic components are generally conditioned in tubes, generally of rigid antistatic plastic of globally rectangular section, offering good mechanical protection and in particular permitting their transport. In certain cases, the tube's profile is specifically adapted to the type of component it contains, for example to the shape and distribution of their pins. During their conditioning, the components are slid one after the other into a tube, in which they are held one behind the other. The tubes are closed at each extremity by a generally crude stopper designed to prevent the components from coming out.

In order for them to be subsequently processed, for example by a testing line or by a printed circuit populating device, the components must be extracted from the tubes. This operation is generally performed by a feeding device that, after having extracted the electronic components from the tubes, transports them to a location from where they will for example be transferred onto the testing line or the printed circuit populating device.

Most of the prior art devices use the force of gravity in order to have the components slide out of the tubes. One of the two stoppers closing the two extremities of each tube is removed. The tubes containing the components are then placed, generally horizontally, in a receptacle from where they will be taken one after the other. The closed extremity of the sampled tube is elevated by means of an often complex mechanism, having the electronic components slide towards the tube's open extremity. However, since the components must preferably be placed horizontally for them to be transferred to another device, their orientation when exiting the tube must be corrected. The components are thus generally slid from the tube onto a parabolic conveyor that will bring them in the desired position.

These prior art devices have several disadvantages. The mechanism allowing one extremity of the component to be raised is often complicated and its processing speed is limited. Furthermore, parabolic conveyors are delicate and costly to make. They are generally guides having a very precise profile along which the components slide under the effect of the gravitational force. With generally increasing rates of processing lines and decreasing sizes of components, these guides must be machined with a very high degree of accuracy in order for the components to be able to slide on them with the necessary throughput and precision. Each time the type of component processed by the device changes, a new guide must be installed, which often requires long adjustments during which the device is not operational.

In order to avoid these disadvantages, certain prior art feeding devices make use of pushing mechanisms allowing the components to be extracted whilst the tube remains in horizontal position. The tube is generally aligned with a linear conveyor bringing the extracted components to the location from where they will for example be transferred onto a processing line. Although these devices require no mechanism for elevating the tube nor any means for correcting the components' orientation such as for example a parabolic rail, the pushing mechanisms used are generally complex and their rate is often limited.

Patent application US 2002/00667980 for example describes a feeding device whose pushing mechanism comprises a steel strip introduced in the tube through one of its extremities in order to push the components towards the other extremity. Such a mechanism is very complex and delicate, mainly because the pushing mechanism's movements must be controlled accurately and synchronized with the rate of the subsequent device, for example a processing line that removes the extracted components. Furthermore, the stoppers must be removed at both extremities of the tube before the latter can be placed in the receptacle of the feeding device, which requires additional manipulations for each tube processed by the device.

U.S. Pat. No. 4,770,565 describes a device in which the electronic components are extracted from their transportation tube by aspiration. One extremity of the transportation tube is inserted into an adapter that is connected on the other side to a tubular conveyor bringing the components to the position from where they will be taken, for example by a placing machine. Air is pulsed into the adapter in the direction of the conveyor, creating a partial air vacuum at the transportation tube's exit. The components are thus aspirated out of the tube towards the adapter. Such a system has however the major disadvantage that it is difficult to control the extraction of the components from their transportation tube, in particular the regularity and speed of extraction. The partial air vacuum aspirating the components out of their tube is generated by a flow of compressed air directed towards the adapter's opposite exit. The intensity of the air vacuum behind this flow, and consequently the force with which the components are extracted, cannot in this manner be controlled precisely. Furthermore, inside the adapter, the components pass from a partial air vacuum behind the air flow to an overpressure zone after the nozzle through which the air is pulsed. They must thus go through a zone of turbulence in which their linear displacement is strongly disrupted, which considerably increases the risk of jamming. The shape and dimensions of the adapter are furthermore specifically adapted to a single type of transportation tube and to a single type of component. If the device is to process successively different types of components conditioned in different transportation tubes, it must each time be equipped with a new adapter and possibly with a new conveyor.

U.S. Pat. No. 5,368,193 describes a case for electronic components comprising a spiral-shaped receptacle. This document also describes an adapted feeding device allowing air to be insufflated through openings provided for this purpose in the case in order to extract the components. Use of such a device is however very limited since it is specifically adapted to this type of cases that correspond to no industrial standard.

It is thus an aim of the present invention to propose a method and a device for extracting electronic components that does not have the disadvantages of the prior art methods and devices.

BRIEF SUMMARY OF THE INVENTION

These aims are achieved by a method and a device having the characteristics of the corresponding independent claim, advantageous embodiments being furthermore indicated in the dependent claims.

These aims are achieved in particular by a method for extracting electronic components from a tube, according to which the electronic components are extracted from the tube by means of pneumatic means. These aims are also achieved by a device for extracting electronic components from a tube, comprising a pneumatic system for extracting electronic components, and by a device for feeding with electronic components a processing line comprising such an extraction device. Use of pneumatic means for extracting electronic components offers among other advantages that of allowing the tube to remain in horizontal position whilst avoiding the use of delicate and complicated mechanical means.

BRIEF DESCRIPTION OF THE DRAWINGS

The present invention will be better understood by reading the description of a preferred embodiment illustrated by the FIGS. 1 to 6, in which.

DETAILED DESCRIPTION OF THE INVENTION

Figure 1:
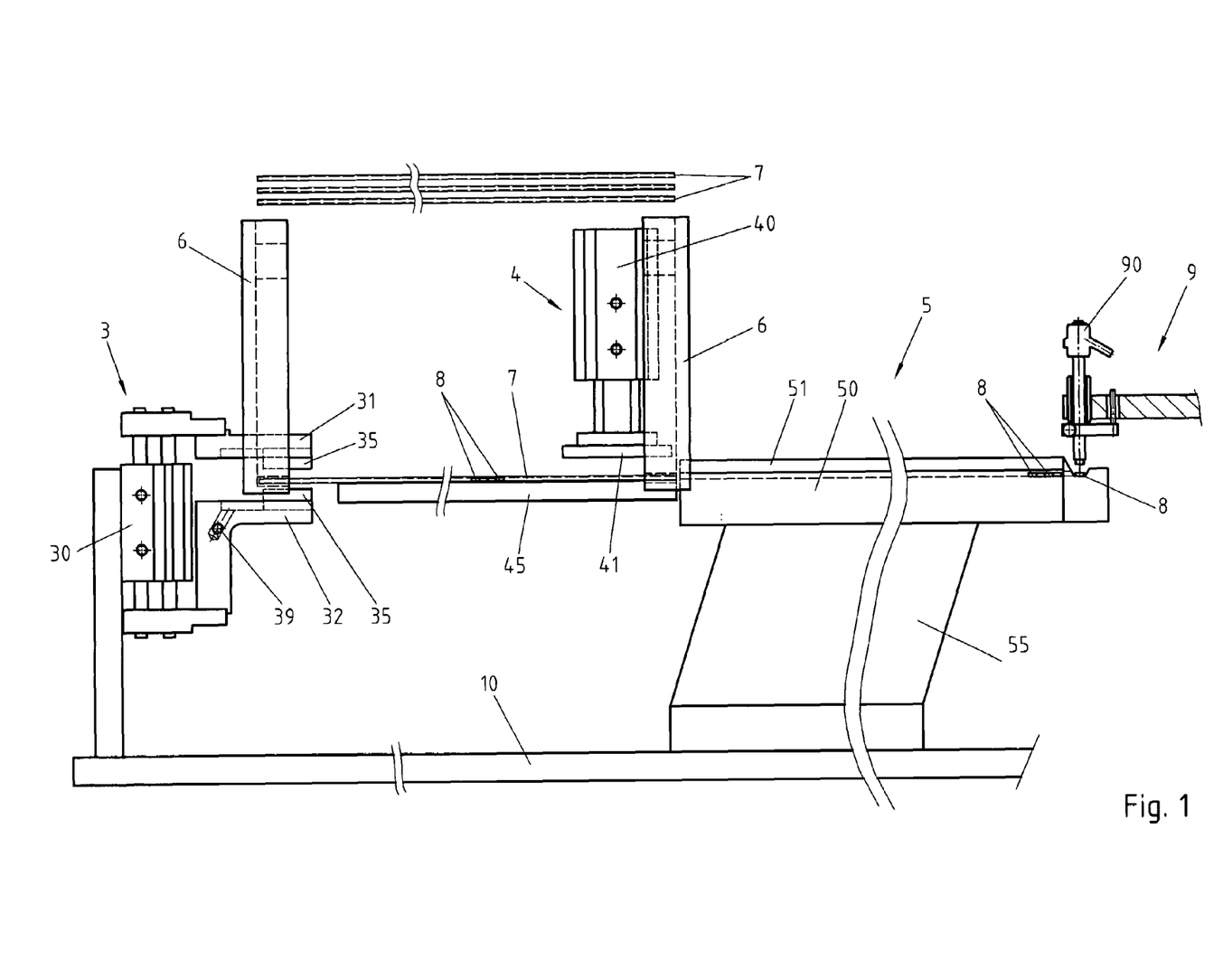
FIG. 1 shows a side view of a feeding device comprising an extraction device according to a preferred embodiment of the invention.
Figure 2:
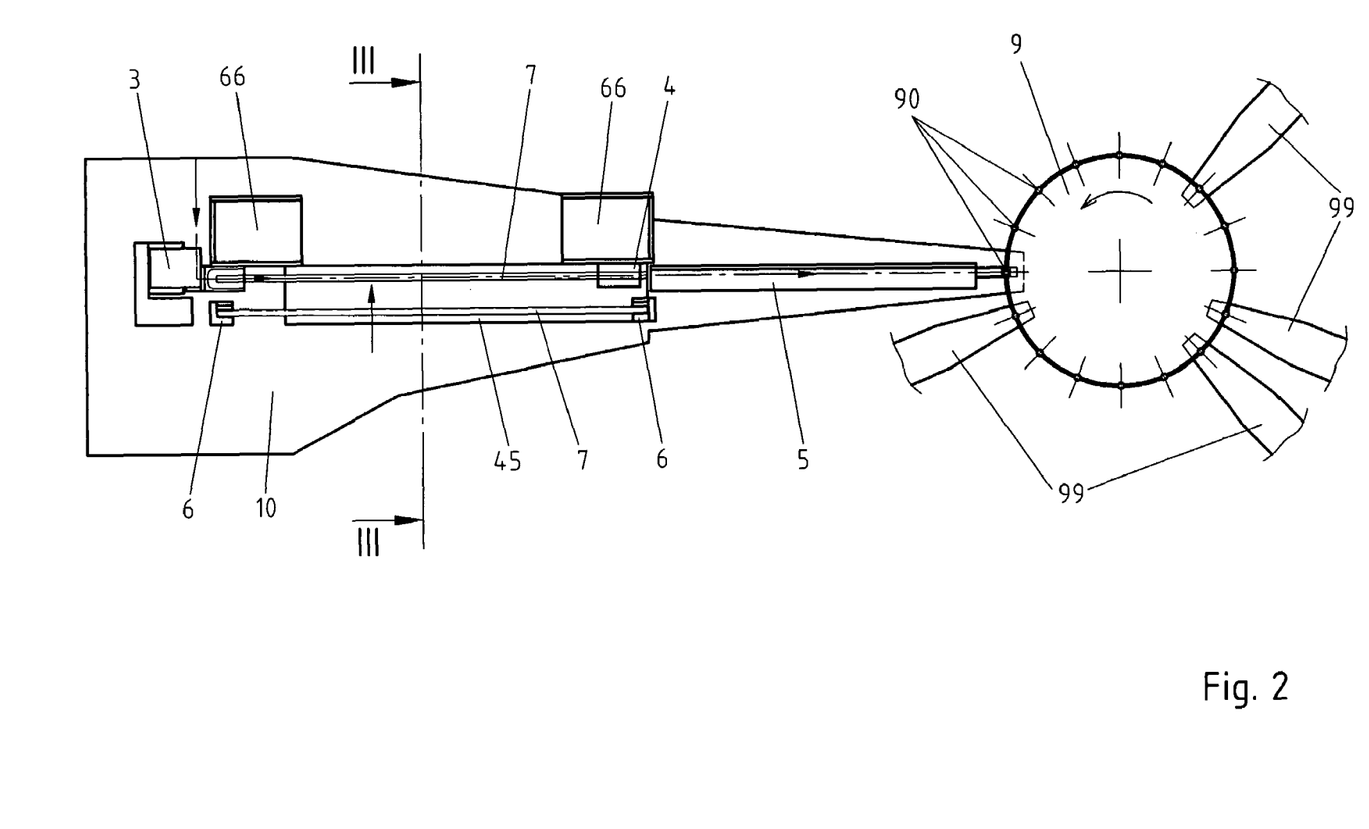
FIG. 2 shows a top view of the device of FIG. 1.

In a preferred embodiment, the extraction device of the invention is integrated in an electronic component feeding device designed to work with a processing line, for example a testing and/or conditioning line, articulated around a circular conveyor 9 (FIGS. 1 and 2). The feeding device extracts the electronic components 8 from the tubes 7 and makes them available to the circular conveyor 9. The circular conveyor 9 is equipped on its periphery of component-holders, for example aspiration nozzles 90, allowing the components 8 to be removed and transported to the other stations 99 of the processing line, partially represented in FIG. 2, such as for example testing, marking and/or conditioning stations.

The feeding device, in the same manner as the other stations 99, is advantageously fastened onto a supporting plate 10 comprising for example fastening elements (not represented) designed to work with fastening elements on a fixed plate (not represented), preferably placed under the circular conveyor 9. The processing line is thus formed in a modular fashion by fastening around the circular conveyor 9, on the fixed plate (not represented), the different processing stations that constitute it. The position of each processing station relative to the conveyor 9 is determined precisely by the accurate location and the exact dimensions of the respective fastening elements.

In a preferred embodiment, the inventive feeding device comprises a conveyor, preferably a linear conveyor 5, for transporting the electronic components 8 extracted from the tubes 7 towards a location from where they will be taken by the aspiration nozzles 90 of the circular conveyor 9. The linear conveyor 5 is for example a vibratory conveyor on which the electronic components 8 move under the effect of the vibrations of an electromagnetic or piezoelectric vibrator 55. The linear conveyor 5 comprises for example a base 50 fastened on the vibrator 55 and on which a rail is formed to guide the components' movement. The rail's profile is advantageously adapted to the type of components to be conveyed. It is preferably similar to the inner profile of the tubes 7. The base 50 is covered by a cover 51 preventing the components to involuntarily come off the rail. According to the configurations, the lower side of the cover 51 can also be profiled in order to contribute to guiding the components.

The inventive extraction device onto which the tubes 7 are emptied of their electronic components 8 is placed close to the extremity of the linear conveyor 5 that is opposed to the circular conveyor 9. It is placed in such a manner that, when the electronic components 8 are extracted, the tube 7 to be emptied is aligned relative to the linear conveyor 5. The electronic components 8 extracted from the tube 7 are then introduced directly into it.

The extraction device comprises a support 45 onto which, while the electronic components 8 are extracted, the tube 7 is preferably held by mechanical means, for example by a press 4 comprising a shoe 41 for pressing the tube 7 without damaging it, connected to a linear actuator 40.

A pincer 3 comprising two jaws 31, 32 moved for example by a linear actuator 30, is placed so as to be able to grasp the extremity of the tube 7 opposed to the linear conveyor 5. A clearance with greater dimensions than those of the tube 7 is formed inside the jaws 31, 32. It is at least partially filled with a mouldable and compressible material, for example an airtight foam 35, moulding itself onto the outer profile of the tube 7 when the pincer 3 is closed onto the latter. The pincer 3 is connected to a pneumatic system (not represented) through a conduit 39 provided for example in the lower jaw 32.

The feeding device preferably comprises a receptacle, placed preferably in parallel to the extraction device, making it possible to receive a certain number of tubes 7 capable of containing the electronic components 8. The receptacle is for example constituted of two rails 6 placed more or less vertically and placed in such a manner that, through their U-profile for example, each holds one extremity of the tubes 7 located in the receptacle, thus preventing them from moving in the horizontal plane whilst allowing them to slide vertically. Mechanical means (not represented) allow the transfer of the tubes 7 from the receptacle to the extraction device. Recovery receivers 66, visible in FIG. 2, situated for example on the other side of the extraction device, receive the empty tubes.

The tubes 7 containing the electronic components 8 that are to be introduced onto the processing line by the feeding device are thus placed one on top of the others in the receptacle. In order to prevent the electronic components 8 from coming out, the tubes 7 are usually closed at both extremities by a generally crude stopper, constituted for example by a piece of foam or of plastic introduced in the tube 7 or by a plastic nail traversing the tube 7 along an axis perpendicular to its longitudinal axis. Before introducing them in the receptacle, at least one extremity of each tube 7 is unstoppered, generally by hand, in order to allow the electronic components 8 to be extracted. The tubes 7 are then transferred one by one from the receptacle to the extraction device to be emptied of their components.

Figure 3A:
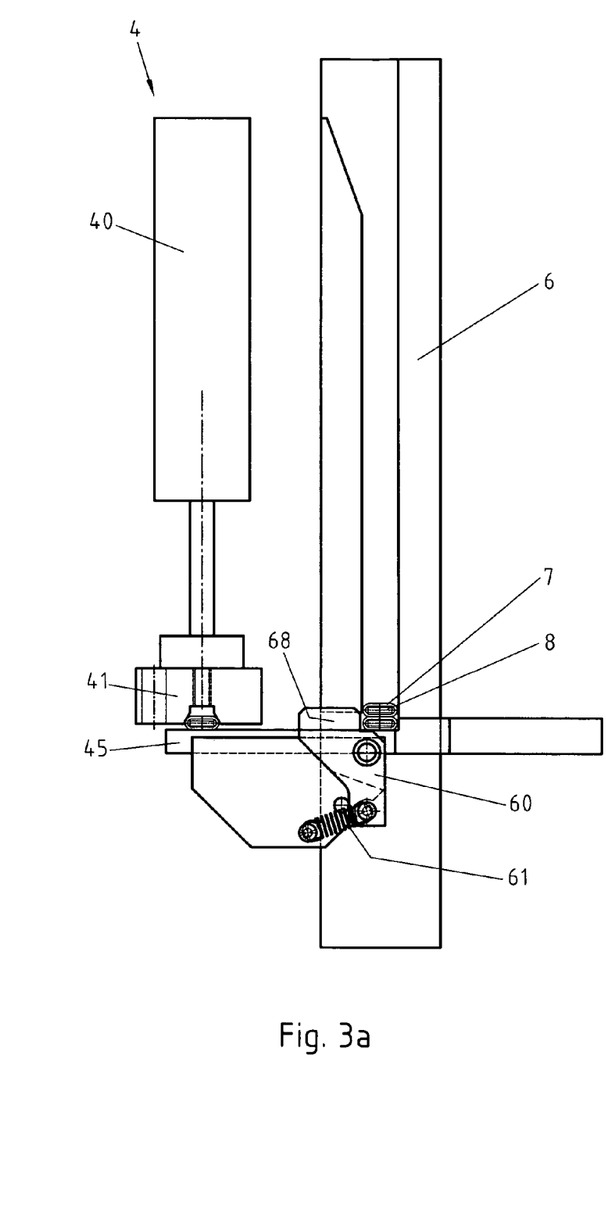
FIG. 3a shows a partial cross section along the axis III-III of the device of FIGS. 1 and 2.
Figure 3B:
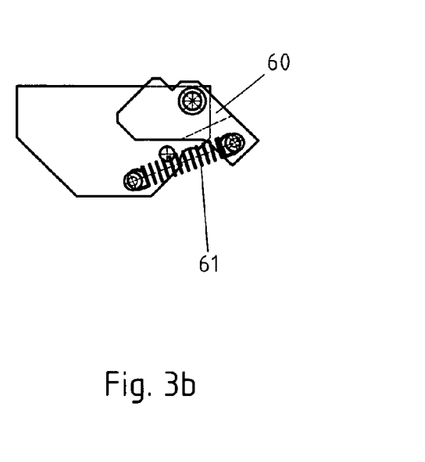
FIG. 3b illustrates the way in which the opening mechanism of the receptacle of the device of FIGS. 1 and 2 works.

FIG. 3a shows a detail of the receptacle and part of the mechanical means allowing the tubes 7 to be transferred from the latter towards the extraction device. At its lower extremity, the profile of the rail 5 holding the extremity of the tubes 7 in the horizontal plane is open in order to allow the lower tube 7 to pass. The latter is held in the receptacle by at least one stop 60. An actuator (not represented) makes it possible to pivot the stop 60 around its axis (FIG. 3b), thus freeing the lower tube that can then be pushed onto the support 45 by mechanical means (not represented) in the direction of the extraction device. Once in the axis of the linear conveyor, the tube 7 is held in its position by the shoe 41 whose lower profile is preferably formed in order to ensure, or even correct, its alignment relative to the linear conveyor.

Figure 4:
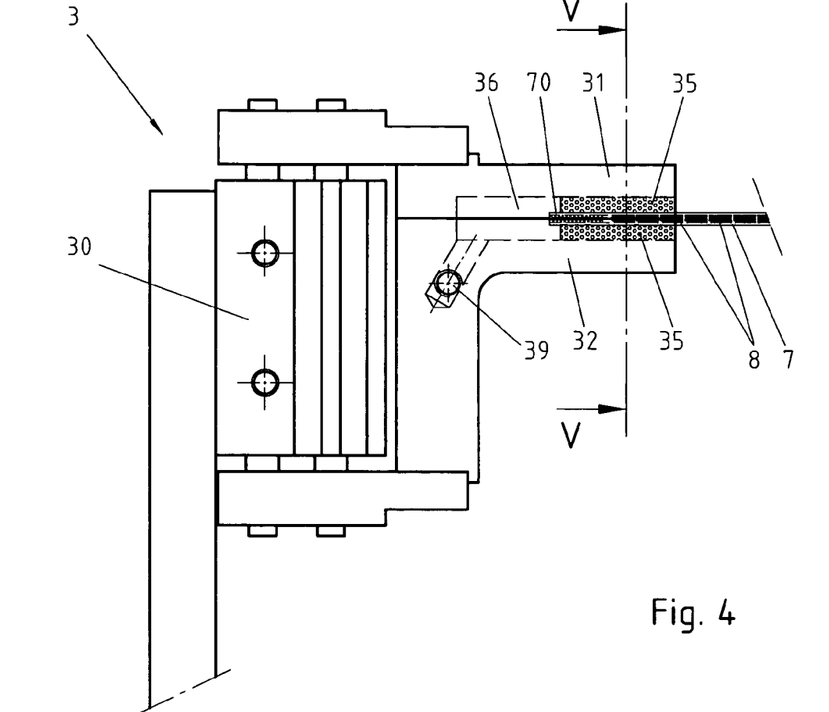
FIG. 4 shows a partial view of the extraction device according to a preferred embodiment of the invention.
Figures 5, 6:
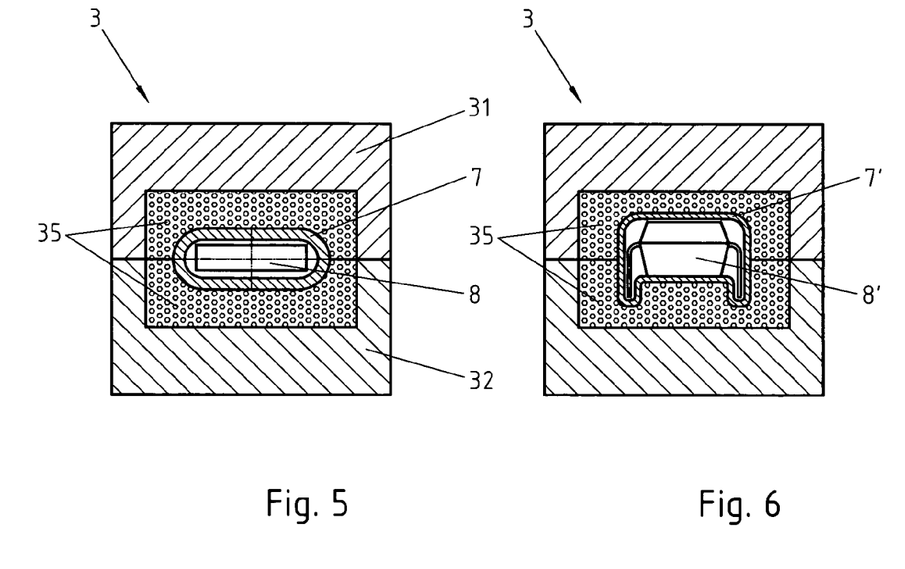
FIG. 5 shows a cross section along the axis V-V of the device of FIG. 4.
FIG. 6 shows a cross section similar to the cross sectional view of FIG. 5 when the extraction device is used for another type of tube.

The pincer 3 is closed on the extremity of the tube 7 (FIG. 4). As illustrated in FIG. 5, the airtight foam 35 inside the jaws 31, 32, then moulds itself closely to the outer profile of the tube 7. The portion of the clearances formed in the jaws 31, 32 that are not filled with foam 35 then build a chamber 36 that is hermetically sealed, connected through the intermediary of the conduit 39 to the pneumatic system (not represented).

The one skilled in the art will however understand that it is also possible to hermetically seal the chamber 36 around the tube 7 by other means than foam 35. It would for example be conceivable to provide jaws whose profile would be perfectly adapted to the outer profile of the tube 7, possibly equipped with gaskets of plastic material further improving the tightness. The advantage of the solution proposed in the preferred embodiment described further above is however illustrated in FIG. 6. It is possible, thanks to the properties of the mouldable and compressible foam 35, to use the same pincer 3 for extracting several types of electronic components, conditioned in tubes having very different outer profiles. The foam 35 moulds itself as well to the profile of a tube 7 with a globally elliptical or rectangular profile containing for example leadless electronic components 8 as to the profile of a tube 7' adapted for example to the conditioning of electronic components 8' having exit leads.

When the pincer is closed, the foam 35 preferably does not cover the whole extremity of the tube 7 that is in the chamber 36. In order to extract the components 8 from the tube 7, compressed air is brought preferably continuously by the pneumatic system into the chamber 36 through the conduit 39, thus generating an overpressure. Since the stopper 70 closing the extremity of the tube 7 is not hermetic, the overpressure generated in the chamber 36 spreads into the tube 7 from the extremity that is in the chamber 36, pushing the components 8 towards the open extremity of the tube 7 aligned with the linear conveyor 5. The components 8 are thus expelled in a continuous flow from the tube 7 by the overpressure generated in the chamber 36 and transferred one after the other onto the linear conveyor 5. The one skilled in the art will however understand that it is also conceivable within the framework of this invention to expel the components 8 one by one from the tube 7 by short successive impulses of compressed air for example.

When the tube 7 is entirely emptied of its components 8, for example after a determined period during which overpressure is applied, the pincer 3 is opened and the shoe 41 is lifted. The tube 7 is then evacuated into the receivers 66 below the support 45 by mechanical means (not represented). A new tube 7 can then be brought from the receptacle towards the extraction device.

The functioning of the feeding device is preferably entirely automated and controlled by a control system (not represented). The control system thus advantageously controls all the device's elements, in particular the actuators and the pneumatic system, and processes the signals possibly received for example from different sensors, probes or other control elements enabling the correct operation of the device to be checked and possible breakdowns to be detected. The centralized and automated control and supervision of all the operations allows the feeding device to optimize its work rate, in particular thanks to the perfect synchronization of all its elements.

According to the invention, the extraction device uses pneumatic means for extracting the components 8 from their tubes 7, enabling the latter to remain in horizontal position during the entire operation. The inventive extraction device thus makes it possible to avoid using complex mechanical means generally necessary to elevate the tubes in the devices using gravitational force. The mechanical means for implementing the method of the invention are also much simpler and sturdier than the pushing devices used by the prior art extraction devices allowing the components to be extracted from tubes placed horizontally.

Use of pneumatic means for extracting components can further allow the inventive device to reach higher rates than the rates of the prior art devices, notably of the devices using gravitational force.

An additional advantage of the extraction device of the invention is that it allows the components 8 to circulate in both directions in the tube 7.

The dimensions of the current electronic components tend to become ever smaller. Moreover, in order to further increase the tubes' capacity, they are often placed widthwise, i.e. their largest dimension is placed perpendicularly to the longitudinal axis of the tube. These two factors thus diminish the lateral hold of the components in their tube, allowing them to be placed slightly askew. It thus frequently happens that an electronic component is sufficiently aslant so that for example one of its angles becomes wedged against the inner side of the tube, also blocking the following components. In such situations, an additional force applied on the components in the direction of the tube's exit does not resolve the problem, as the jammed component will tend to become wedged even more firmly in the tube.

The prior art extraction devices generally offer no automatic solution to this problem: the partially emptied tube is removed from the device, the jammed component is manually replaced and the tube is reinserted onto the device. This method consequently requires additional work, apart from the fact that the presence of jammed components cannot be detected, thus causing a risk that they are thrown away with the tube considered empty.

According to a preferred embodiment of the invention, the pneumatic system not only allows compressed air to be introduced inside the chamber 36, but also enables air therein to be aspirated, for example through the conduit 39. A depression is thus created inside the chamber 36 that spreads into the tube 7, attracting the electronic components 8 that are there towards the pincer 3. The components, for example components jammed during extraction, are thus re-directed in the direction of the pincer 3. By alternating short periods of aspiration with quick impulses of compressed air, the pneumatic system generates a to-and-fro movement of the components 8 in the tube 7. A few alternated movements are generally sufficient to resolve most obstruction problems. The extraction process can then resume and the compressed air is again introduced in a continuous manner inside the chamber 36 until the components have been completely extracted.

The extraction device according to the invention thus preferably comprises control means (not represented), for example optical sensors, for detecting the presence of the electronic components 8 in the tube 7 and the transfer of the components from the tube 7 onto the linear conveyor 5. The information issuing from these control means is transmitted to the device's control system. When the control system receives the information that, during an extraction phase, electronic components 8 are still present in the tube 7 whereas no component is being transferred from the tube 7 to the linear conveyor 5, the control system sends to the pneumatic system the order to generate a to-and-fro movement of the components according to the aforementioned principle, then to re-establish in the chamber 36 the pressure necessary for extracting the components. If the tube is unblocked, i.e. if a transfer of components from the tube 7 to the linear conveyor 5 is detected by the control means, the normal extraction of the components 8 is continued. In the contrary case, the control system launches a new series of alternating movements of the components.

According to a variant embodiment of the invention, the press 4 is fastened onto a vibratory system (not represented) fastened directly or indirectly onto the supporting plate 10. The tube 7 is then preferably grasped between the shoe 41 of the press 4 and an additional shoe (not represented) also fastened to the vibratory system, whose upper side is more or less at the same height as the upper side of the support 45. The vibratory system thus allows the extremity of the tube 7 close to the linear conveyor 5 to be vibrated, preferably quickly and with a small amplitude. If the electronic components 8 jam during extraction, the vibratory system is advantageously switched on in parallel to the to-and-fro movements of the components 8 in the tube 7. These vibratory movements of the extremity of the tube 7 make it in particular possible to unblock the electronic components 8 that might be wedged between the exit of the tube 7 and the entry of the linear conveyor 5.

According to the previously mentioned embodiment of the invention, the extraction device is particularly suited for extracting electronic components conditioned in tubes whose longitudinal sides are closed on their entire length, such as for example the tubes 7 and 7' whose profiles are represented in FIGS. 5 and 6. Since the closed tube is airtight on its entire length, the overpressure and/or depression created inside the chamber 36 by the pneumatic system spreads optimally, allowing good control of the movement of the electronic components to be extracted.

Figure 7:
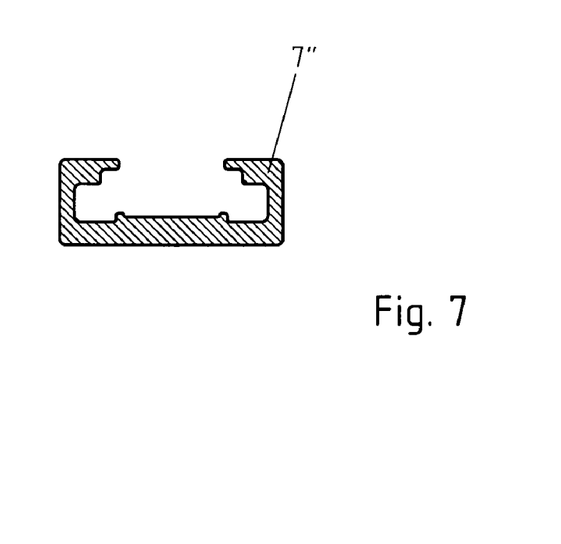
FIG. 7 shows the profile of another type of tube that is open on its upper part.

However, certain tubes used for conditioning electronic components are at least partially open, i.e. their profile is discontinued on at least part of their length. FIG. 7 illustrates for example the profile of a tube 7" that is open on its upper part. Since these tubes are not airtight on their entire length, the differences of pressure generated by the pneumatic system in the chamber 36 of the pincer 3 spread efficiently only until the first lateral opening encountered by the corresponding air flows, thus preventing an efficient control of the components located beyond this opening. Although this lack of efficiency can be compensated, for the movement of the components towards the exit of the tube opposed to the pincer 3, by increasing the pressure of the air injected into the chamber 36, it is practically impossible to compensate it in the case where the components must be re-directed by aspiration towards the pincer 3.

Figure 8:
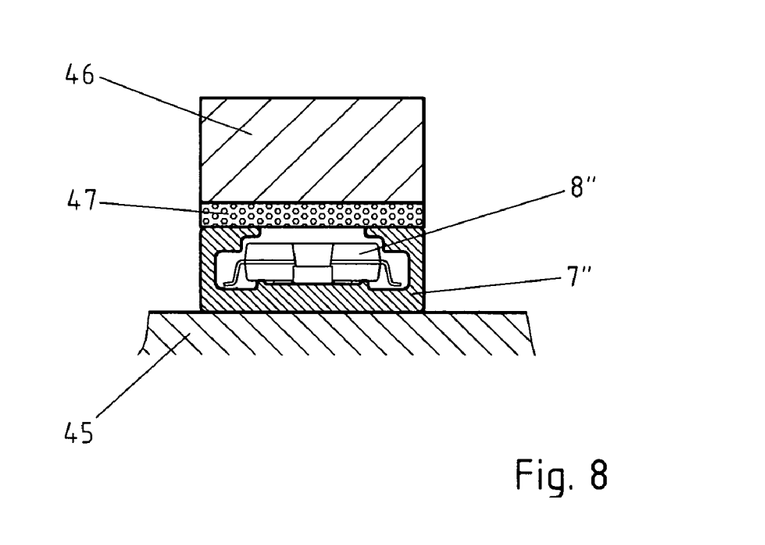
FIG. 8 shows a variant embodiment of mechanical means for closing the tube of FIG. 6.
Figure 9:
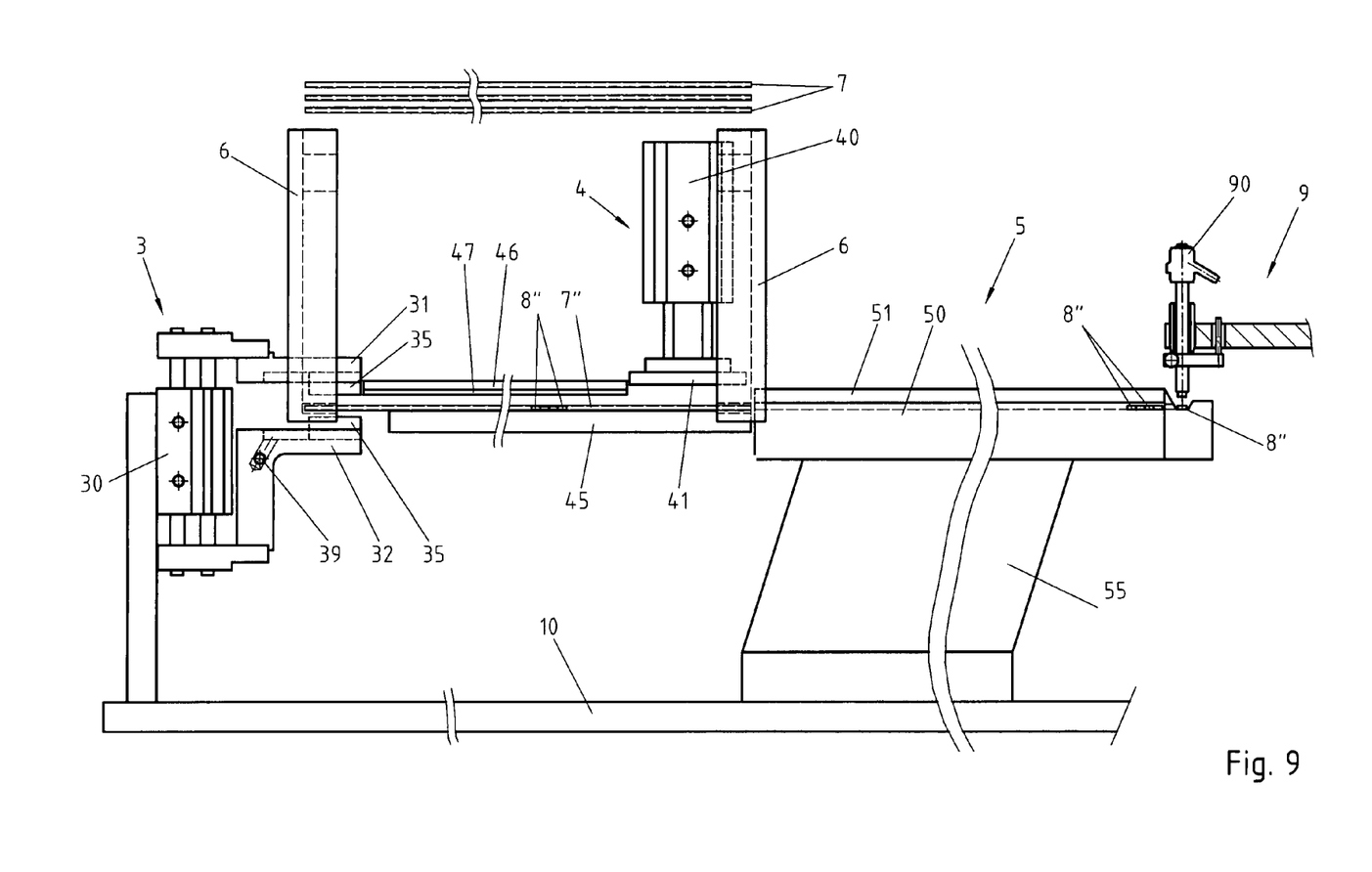
FIG. 9 shows a side view of a feeding device comprising an extraction device according to a variant embodiment of the invention, with the mechanical means for closing the tube of FIG. 8.

FIGS. 8 and 9 thus illustrate by way of example a preferred embodiment of the inventive device adapted for extracting electronic components conditioned in open tubes, for example in a tube 7" open on its upper part. The extraction device then preferably comprises mechanical means allowing at least part of the tube's opening or openings to be closed, thus ensuring that the latter is sufficiently airtight for the electronic components therein to be extracted efficiently, according to the inventive method.

Barring contrary indications, the same elements are designated by the same reference numbers in the FIGS. 1 to 9.

According to the variant embodiment illustrated by the FIGS. 8 and 9, the mechanical means for closing at least partially the tube 7" preferably comprise a cover 46 that is placed on the tube 7" when the latter is in position on the support 45 for extracting the components 8" it contains. The length of the cover 46 is preferably sufficient to cover the entire upper length of the tube 7" between the shoe 41 and the pincer 3. In order to increase further the tightness of the tube 7", the lower surface of the cover 46 is preferably at least partially covered by a gasket 47 of a supple and airtight material, for example of rubber. The gasket 47 is however preferably sufficiently rigid to prevent it from coming into contact with the electronic components 8" inside the tube 7" when the cover 46 is lowered, which could hinder their extraction.

Preferably, the cover 46 is motorized and its movements are controlled by the device's control system. The cover 46 is for example moved vertically by a linear actuator (not represented), for example by a pneumatic thrustor or an electromagnetic actuator, which lowers it and presses it with a predetermined force onto the tube 7" when the latter is placed in extraction position on the support 45. The movements of the cover 46 are preferably automated and coordinated with those of the pincer 3 and of the shoe 41 so that the three elements are closed and/or lowered onto the tube 7" at the same time, a little before the extraction of the components 8" is performed and controlled in the manner explained above. Once the tube 7" is emptied of its electronic components 8", the cover 46 is lifted while the pincer 3 is opened and the shoe 41 is raised. The empty tube 7" can then be evacuated from the support 45 to be replaced by a full tube for which the aforementioned steps are repeated.

According to the variant embodiment described here above by way of example, the mechanical means for closing at least partially the open tube 7" comprise a cover 46 placed between the pincer 3 and the shoe 41. The one skilled in the art will however understand that other forms of covers, motorized or not, are possible within the framework of the invention. The one skilled in the art will also understand that the tightness of the open tube can be ensured by other mechanical means. It is for example conceivable to size the shoe 41 so that it covers the upper part of the tube from the pincer 3 up to its opposed extremity, to size the upper jaw 31 of the pincer 3 so that it covers the open tube until the shoe 41, or to combine these two elements.

Within the framework of the invention, the extraction device can also be adapted for extracting electronic components from tubes that are open on their lower part, for example by covering at least partially the support 4 with a flexible and airtight material onto which the open tube is placed during extraction of the components, or from tubes open on the sides by profiling for example the support 45 so that the open tube can be inserted fully or by using specific covers placed vertically on one or two sides of the open tube. Any combination of the aforementioned solutions is of course conceivable within the framework of the invention, according to the size and disposition of the openings of the tubes to be processed.

In the preceding examples, the extraction device of the invention allows the electronic components to be extracted from one tube. The one skilled in the art will easily understand that it is conceivable to adapt the inventive extraction device in order for it to be able to extract simultaneously electronic components from several tubes in parallel. The device is then equipped with several pincers 3 and of several shoes 41 to hold the desired number of tubes. It is also possible to provide pincers and shoes adapted for holding simultaneously several tubes. The pincer then has either a single pressurized chamber hermetically connected with all the tubes it grasps, or several chambers connected each to a single tube, thus allowing the extraction of the electronic components of each tube to be controlled.

In the case of an extraction device capable of processing a plurality of tubes in parallel, the feeding device of the invention is also adapted for receiving the electronic components extracted from these tubes to make them available, for example, to one or several processing lines. The feeding device is then for example equipped with a corresponding number of parallel linear conveyors or of a single conveyor having several entries and a single exit point.

The invention claimed is:

1. A method for extracting electronic components conditioned in a rectilinear tube permitting their transport, said method comprising the steps of:
    providing said tube including at least one opening on its upper surface, said opening extending along the entire length of said tube;
    closing said at least one opening using mechanical closing means; and
    extracting said electronic components from the closed tube through an overpressure being generated at an extremity of said tube with pneumatic means.

2. The method of claim 1, said closing step comprising the covering of said upper surface by a cover.

3. The method of claim 1, said overpressure being generated by compressed air being injected into said tube.

4. The method of claim 1, comprising the step of hermetically connecting said extremity of said tube to said pneumatic means.

5. The method of claim 1, comprising a step of generating a depression at said extremity of said tube to invert the direction in which said electronic components circulate in said tube.

6. The method of claim 5, the correct extraction of said components being controlled by optical detectors.

7. The method of claim 5, comprising a step of generating a depression at said extremity of said tube in case of incorrect extraction of said components.

8. The method of claim 1, the correct extraction of said components being controlled automatically.

9. The method of claim 1, comprising the simultaneous extraction of electronic components from a plurality of tubes.

10. A system for supplying components, comprising:
    a rectilinear tube comprising at least one opening on its upper side, said opening extending along the entire length of said tube; and
    an extraction device for extracting electronic components conditioned in said rectilinear tube permitting their transport, said device comprising:
        a pneumatic system allowing an overpressure to be created at one of the extremities of said tube with pneumatic means for extracting said electronic components from said tube, and
        mechanical closing means enabling at least one said opening on said upper side of said tube to be closed.

11. The extraction device of claim 10, said pneumatic system allowing compressed air to be injected into said tube.

12. The extraction device of claim 10, said pneumatic system comprising means for hermetically connecting an extremity of said tube to said pneumatic system.

13. The extraction device of claim 12, said connecting means comprising a pincer for grasping said extremity.

14. The extraction device of claim 13, said pincer comprising a compressible and mouldable material capable of moulding itself to the outer profile of said tube when said pincer grasps said extremity.

15. The extraction device of claim 14, said compressible and mouldable material being an airtight foam.

16. The extraction device of claim 13, said pincer building a chamber connected to said pneumatic system and hermetically connected to said extremity when said pincer grasps said extremity.

17. The extraction device of claim 13, said pincer comprising two jaws.

18. The extraction device of claim 17, said two jaws being padded with compressible and mouldable material.

19. The extraction device of claim 10, said pneumatic system enabling a depression to be generated at an extremity of said tube to invert the direction in which said electronic components circulate in said tube.

20. The extraction device of claim 10, said pneumatic system being designed so as to generate a to-and-fro movement of the electronic components in said tube.

21. The extraction device of claim 20, said pneumatic system allowing a depression at an extremity of said tube to be created.

22. The extraction device of claim 10, comprising control means for automatically controlling the extraction of said electronic components from said tube.

23. The extraction device of claim 22, said control means comprising at least an optical sensor.

24. The extraction device of claim 10, comprising a control system for controlling and/or supervising the functioning of said extraction device.

25. The extraction device of claim 10, for extracting electronic components simultaneously from a plurality of said tubes.

26. A system for supplying components, comprising:
    a rectilinear tube comprising an opening on its upper side, said opening extending along at least a majority of the length of said tube; and
    an extraction device for extracting electronic components conditioned in said rectilinear tube permitting their transport, said device comprising:
        a pneumatic system including a pincer for grasping an extremity of said tube, said pneumatic system adapted for utilizing pneumatic means for providing a pressure difference at said extremity for extracting said electronic components from said tube, wherein said pincer includes a compressible and mouldable material capable of moulding itself to the outer profile of said tube when said pincer grasps said extremity; and
        mechanical closing means for closing said opening.

27. A system for supplying components, comprising:
a plurality of rectilinear tubes, each one of said rectilinear tubes comprising an opening on an upper side, said opening extending along at least a majority of the length of each one of said tubes, each one of said tubes having a pair of opposed extremities; and
an extraction device for extracting electronic components conditioned in said plurality of rectilinear tubes permitting their transport, said device comprising:
- means for stacking said plurality of tubes,
- a pneumatic system including a pincer having two jaws for grasping one of the extremities of a chosen one of said stacked tubes, said pneumatic system adapted for providing a pressure difference at the grasped extremity of the chosen tube for generating a to-and-fro movement of the electronic components in the chosen tube and for extracting said electronic components from the chosen tube, wherein said jaws include a compressible and mouldable material adapted for being moulded to the outer profile of chosen tube when said jaws grasp said extremity in an airtight manner, and
- mechanical closing means for closing said opening, wherein
said device is adapted for replacing said chosen tube with another one of said tubes.

* * * * *